United States Patent
Li et al.

(10) Patent No.: US 10,748,605 B2
(45) Date of Patent: Aug. 18, 2020

(54) MEMORY DEVICE AND PROGRAMMING METHOD OF MULTI-LEVEL CELL (MLC)

(71) Applicant: MACRONIX INTERNATIONAL CO., LTD., Hsinchu (TW)

(72) Inventors: Yung-Chun Li, New Taipei (TW); Ping-Hsien Lin, Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/057,871

(22) Filed: Aug. 8, 2018

(65) Prior Publication Data

US 2020/0051620 A1    Feb. 13, 2020

(51) Int. Cl.
*G11C 11/56*  (2006.01)
*G11C 16/34*  (2006.01)
*G11C 16/10*  (2006.01)

(52) U.S. Cl.
CPC ...... *G11C 11/5628* (2013.01); *G11C 11/5671* (2013.01); *G11C 16/10* (2013.01); *G11C 16/3427* (2013.01); *G11C 16/3459* (2013.01)

(58) Field of Classification Search
CPC . G11C 11/5628; G11C 11/5671; G11C 16/10; G11C 16/3427; G11C 16/359
USPC ............. 365/185.02, 185.11, 185.19, 185.24
See application file for complete search history.

(56) References Cited

U.S. PATENT DOCUMENTS

| | | | | |
|---|---|---|---|---|
| 2010/0321998 | A1* | 12/2010 | Jang | G11C 11/5628 365/185.03 |
| 2012/0008387 | A1* | 1/2012 | Han-Lung | G11C 11/5628 365/185.03 |
| 2012/0243310 | A1* | 9/2012 | Huang | G11C 11/5628 365/185.03 |
| 2013/0311710 | A1* | 11/2013 | Yang | G06F 12/0246 711/103 |

* cited by examiner

*Primary Examiner* — Connie C Yoha
(74) *Attorney, Agent, or Firm* — McClure, Qualey & Rodack, LLP.

(57) ABSTRACT

Provided is a programming method for a memory device including a memory array and a controller. The programming method including: controlling programming on a first page of a first word line by the controller; controlling programming on a first page of a second word line by the controller, the second word line being adjacent to the first word line; controlling for performing a first programming operation on a second page of the first word line by the controller; controlling programming on a first page of a third word line by the controller, the third word line being adjacent to the second word line; controlling for performing the first programming operation on a second page of the second word line by the controller; and controlling for performing a second programming operation on the second page of the first word line by the controller.

12 Claims, 7 Drawing Sheets

MEMORY DEVICE AND PROGRAMMING METHOD OF MULTI-LEVEL CELL (MLC)

BACKGROUND OF THE INVENTION

Field of the Invention

The invention relates in general to a memory device and a programming method thereof.

Description of the Related Art

Recently, non-volatile semiconductor memory device (for example flash memory) has wider application. Flash memory may store data even under no power supply and thus market demand on flash memory is high. In order to increase storage capacity of flash memory, multi-level cell (MLC) memory is developed, wherein a single MLC memory cell may store several bits, i.e., two or more than two bits per cell.

For MLC memory, each physical page may store two or more logical pages. We take the MLC of two bits per cell as following examples. The logical page is classified as high page and low page. The page which is written first is referred as the high page and the page which is written later is referred as the low page.

Figure 1:
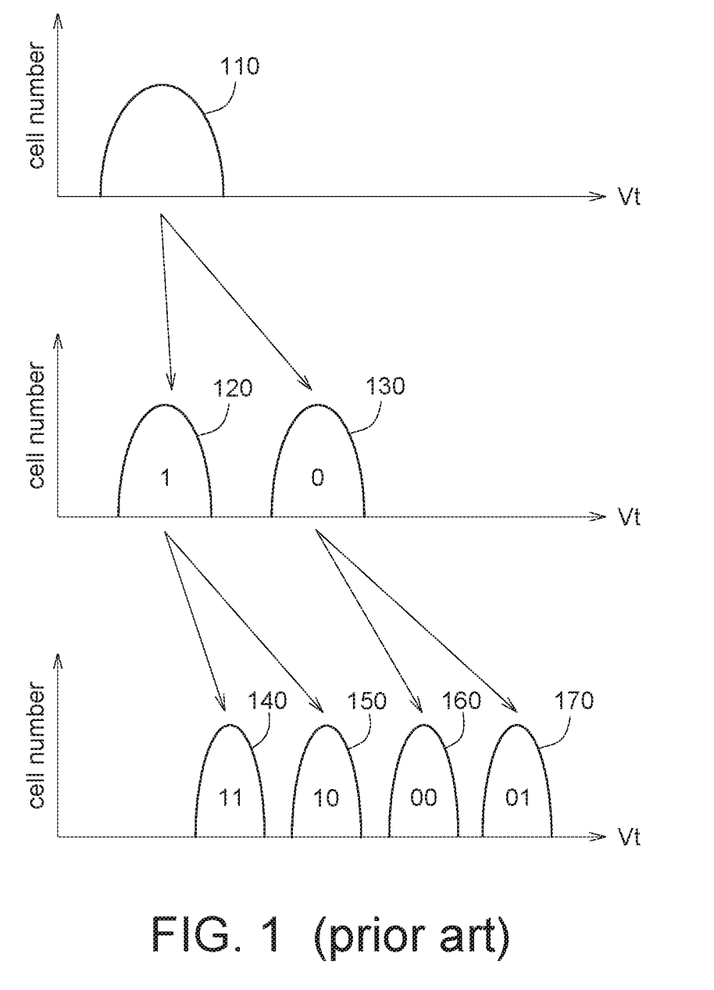
FIG. 1 (prior art) shows a conventional programming method.

FIG. 1 shows a conventional programming method. The curve 110 refers to a threshold voltage distribution of the physical page before programming. Thus, all memory cells on the physical pages are unprogrammed. The high page of the physical page is applied by at least one programming voltage and thus the memory cells have threshold voltage distribution 120 and 130. The logic 1 high page has the threshold voltage distribution 120, and the logic 0 high page has the threshold voltage distribution 130. Then, the low page of the physical page is applied by at least one programming voltage. Thus, the memory cells having logic 11 have threshold voltage distribution 140; the memory cells having logic 10 have threshold voltage distribution 150; the memory cells having logic 00 have threshold voltage distribution 160; and the memory cells having logic 01 have threshold voltage distribution 170.

Incremental Step Pulse Programming (ISPP) is a common programming implementation. In ISPP, the programming voltage applied to the memory cells are raised until the programming voltage is high enough to program the memory cells to the desired level. After the programming voltage is applied to the memory cells, a verification voltage is applied to the memory cells to verify whether the memory cells are successfully programmed. When the threshold voltage of the memory cells is higher than the verification voltage, the memory cells are successfully programmed. If the threshold voltage of the memory cells is not higher than the verification voltage, the programming voltage is raised until the threshold voltage of the memory cells is higher than the verification voltage.

Figure 2:
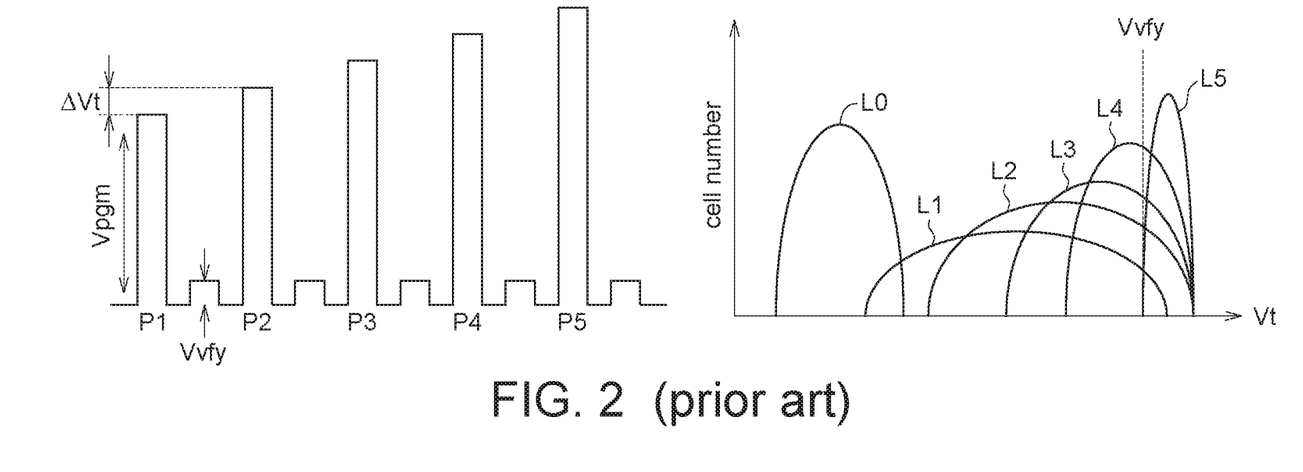
FIG. 2 (prior art) shows an ISPP programming sequence.

FIG. 2 shows an ISPP programming sequence. P1-P5 refer to five programming voltages, P1=Vpgm, P2=Vpgm+$\Delta$Vt, P3=Vpgm+2$\Delta$Vt, P4=Vpgm+3$\Delta$Vt and P5=Vpgm+4$\Delta$Vt. Vpgm refers to an initial programming voltage, and $\Delta$Vt refers to a voltage increment. L1-L5 refer to five threshold voltage distribution after the programming voltages P1-P5 are applied, respectively. L0 refer to the threshold voltage distribution before programming.

After the programming voltage P1 is applied, the memory cells have the threshold voltage distribution L1. It is verified whether the threshold voltage distribution L1 of the memory cells is higher than the verification voltage Vvfy. If not, then the next programming voltage P2 is applied and so on. This is repeated until the threshold voltage distribution of the memory cells is higher than the verification voltage Vvfy.

However, in programming the memory cells, the adjacent memory cells may be negatively affected. The memory cells which should be in programming inhibited may have a shifted threshold voltage due to programming on adjacent memory cells. Therefore, the reliability of the memory device is lowered.

Thus, it needs a memory device and a programming method thereof which may improve the reliability of the memory device.

SUMMARY OF THE INVENTION

According to one embodiment of the present invention, provided is a programming method for a memory device including a memory array and a controller, the memory array including a plurality of memory cells. The programming method includes: controlling programming on a first page of a first word line of the memory array by the controller; controlling programming on a first page of a second word line of the memory array by the controller, the second word line being adjacent to the first word line; controlling for performing a first programming operation on a second page of the first word line of the memory array by the controller; controlling programming on a first page of a third word line of the memory array by the controller, the third word line being adjacent to the second word line; controlling for performing the first programming operation on a second page of the second word line of the memory array by the controller; and controlling for performing a second programming operation on the second page of the first word line of the memory array by the controller.

According to another embodiment of the present invention, provided is a memory device including: a memory array including a plurality of memory cells; and a controller coupled to the memory array, the controller being configured to control: programming a first page of a first word line of the memory array; programming a first page of a second word line of the memory array, the second word line being adjacent to the first word line; performing a first programming operation on a second page of the first word line; programming a first page of a third word line of the memory array, the third word line being adjacent to the second word line; performing the first programming operation on a second page of the second word line of the memory array; and performing a second programming operation on the second page of the first word line of the memory array.

BRIEF DESCRIPTION OF THE DRAWINGS

Common reference numerals are used throughout the drawings and the detailed description to indicate the same elements. The present invention will be more apparent from the following detailed description taken in conjunction with the accompanying drawings.

DETAILED DESCRIPTION OF THE INVENTION

Figure 3:
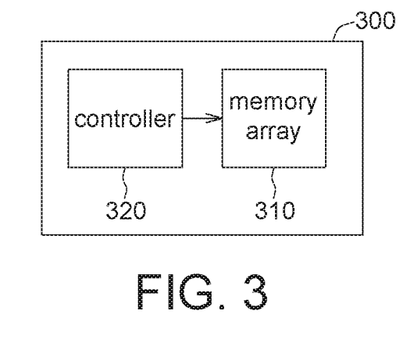
FIG. 3 shows a functional block of a memory device according to an embodiment of the application.

FIG. 3 shows a functional block of a memory device according to an embodiment of the application. Of course, FIG. 3 is simplified and one skilled person in the art would understand that the memory device 300 may further include other necessary elements. The memory device 300 includes a memory array 310 and a controller 320.

The memory array 310 includes a plurality of memory cells arranged in an array, a plurality of word lines and a plurality of bit lines.

The controller is coupled to the memory array 310 for controlling operations (for example but not limited by, programming operations) on the memory array 310.

Figure 4:
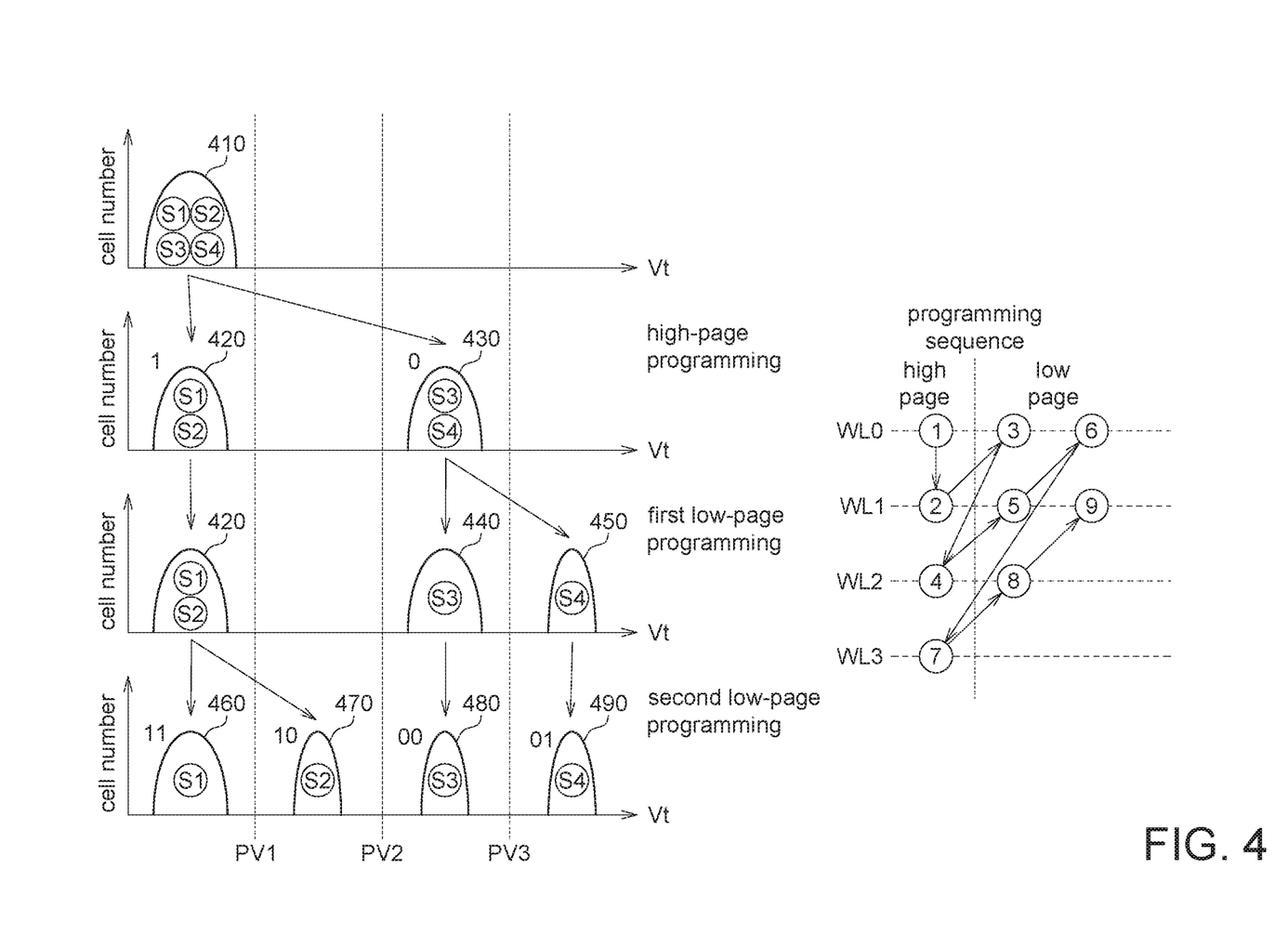
FIG. 4 shows a programming method for a memory device according to an embodiment of the application.

FIG. 4 shows a programming method for a memory device according to an embodiment of the application. WL0-WL3 refers to $0^{th}$ word line to third word line of the memory array 310. As shown in FIG. 4, in programming, the programming sequence is as follows. The high page of the word line WL0 is programmed. The high page of the word line WL1 is programmed. A first programming operation is performed on the low page of the word line WL0. The high page of the word line WL2 is programmed. A first programming operation is performed on the low page of the word line WL1. A second programming operation is performed on the low page of the word line WL0. The high page of the word line WL3 is programmed. And so on.

In convention, after the low pages of the previous word lines are programmed, the later word lines are programmed. However, the low pages of the previous words lines may be suffered by program disturbance caused by programming of the later word lines. Thus, in an embodiment of the application, multi-stage programming operations are performed on low pages of the word lines and the program disturbance may be eliminated by the second programming operations on the low pages of the word lines. For example, programming on high page (and/or low page) of the word lines WL1 would negatively affected the first programming result of the low page of the word line WL0. Thus, in an embodiment of the application, two programming operations are performed on the low page of the word line WL0 to lower programming disturbance caused by programming on the adjacent word line WL1.

In the following, the programming operation is exemplified by ISPP wherein after a programming voltage is applied, three verification voltages PV1, PV2 and PV3 are applied for verification. For easy understanding, in the following, the ISPP have the programming voltage in 14V-23V. Further, 14V-17V is a programming voltage range (or said, the first programming voltage range), 17V-20V is another programming voltage range (or said, the second programming voltage range) and 20V-23V is yet another programming voltage range (or said, the third programming voltage range). However, the application is not limited thereby.

Refer to FIG. 4 again. In FIG. 4, the logic status S1, S2, S3 and S4 refer to logic 11, logic 10, logic 00 and logic 01, respectively.

The threshold voltage distribution 410 refers to the threshold voltage distribution of the physical pages which are erased but not programmed yet. Thus, all memory cells have the threshold voltage distribution 410 before the program.

The high page of the physical page (for example the word line WL0) is programmed. For example, one or more programming voltages in the programming voltage range (17V-20V) are applied to the memory cells. Thus, in the high page, the memory cells having logic 1 have the threshold voltage distribution 420, and the memory cells having logic 0 have the threshold voltage distribution 430. The threshold voltage distribution 420 is lower than the first verification voltage PV1. The threshold voltage distribution 430 is higher than the second verification voltage PV2 but lower than the third verification voltage PV3. In other words, a 17V programming voltage is applied and it is verified whether the threshold voltage distribution 430 is higher than the second verification voltage PV2. If the threshold voltage distribution 430 is not higher than the second verification voltage PV2, the programming voltage is raised (for example but not limited by, from 17V to 17.5V) to verify again. This is repeated until the threshold voltage distribution 430 is higher than the second verification voltage PV2.

A first programming operation is performed on the low page of the physical page (for example WL0). For example, one or more programming voltages in the programming voltage range (20V-23V) are applied to the memory cells. Thus, the memory cells having logic 00 have the threshold voltage distribution 440, and the memory cells having logic 01 have the threshold voltage distribution 450. The threshold voltage distribution 440 is higher than the second verification voltage PV2 but lower than the third verification voltage PV3. The threshold voltage distribution 450 is higher than the third verification voltage PV3. In other words, a 20V programming voltage is applied and whether the threshold voltage distribution 450 is higher than the third verification voltage PV3. If not, the programming voltage is raised (for example but not limited by, from 20V to 20.5V) to verify again. This is repeated until the threshold voltage distribution 450 is higher than the third verification voltage PV3.

A second programming operation is performed on the low page of the physical page (for example WL0). For example, one or more programming voltages in the programming voltage range (14V-17V) are applied to the memory cells. Thus, the memory cells having logic 11 have the threshold voltage distribution 460, and the memory cells having logic 10 have the threshold voltage distribution 470. The threshold voltage distribution 460 is lower than the first verification voltage PV1. The threshold voltage distribution 470 is higher than the first verification voltage PV1 but lower than the second verification voltage PV2. Besides, because the programming voltage is applied, the threshold voltage distribution 440 and 450 will become the threshold voltage distribution 480 and 490, wherein the threshold voltage distribution 480 is higher than the second verification voltage PV2 but lower than the third verification voltage PV3 and the threshold voltage distribution 490 is higher than the third verification voltage PV3. In other words, a 14V programming voltage is applied and it is verified whether the threshold voltage distribution 470 is higher than the first verification voltage PV1. If not, the programming voltage is raised (for example but not limited by, from 14V to 14.5V) to verify again. This is repeated until the threshold voltage distribution 470 is higher than the first verification voltage PV1.

By so, the programming on the memory cells is completed. As shown in FIG. 4, the memory cells having logic 11 (S1) has the threshold voltage distribution 460 (lower than the first verification voltage PV1); the memory cells having logic 10 (S2) has the threshold voltage distribution 470 (higher than the first verification voltage PV1 but lower than the second verification voltage PV2); the memory cells having logic 00 (S3) has the threshold voltage distribution 480 (higher than the second verification voltage PV2 but lower than the third verification voltage PV3); and the memory cells having logic 01 (S4) has the threshold voltage distribution 490 (higher than the third verification voltage PV3).

The right figure on FIG. 4 shows the programming sequence on all word lines of the memory array while the left figure on FIG. 4 shows the programming sequence on a single word line.

As described above, in an embodiment of the application, two programming operations are performed on the low page. The programming disturbance caused by programming on adjacent word lines is eliminated.

Figure 5:
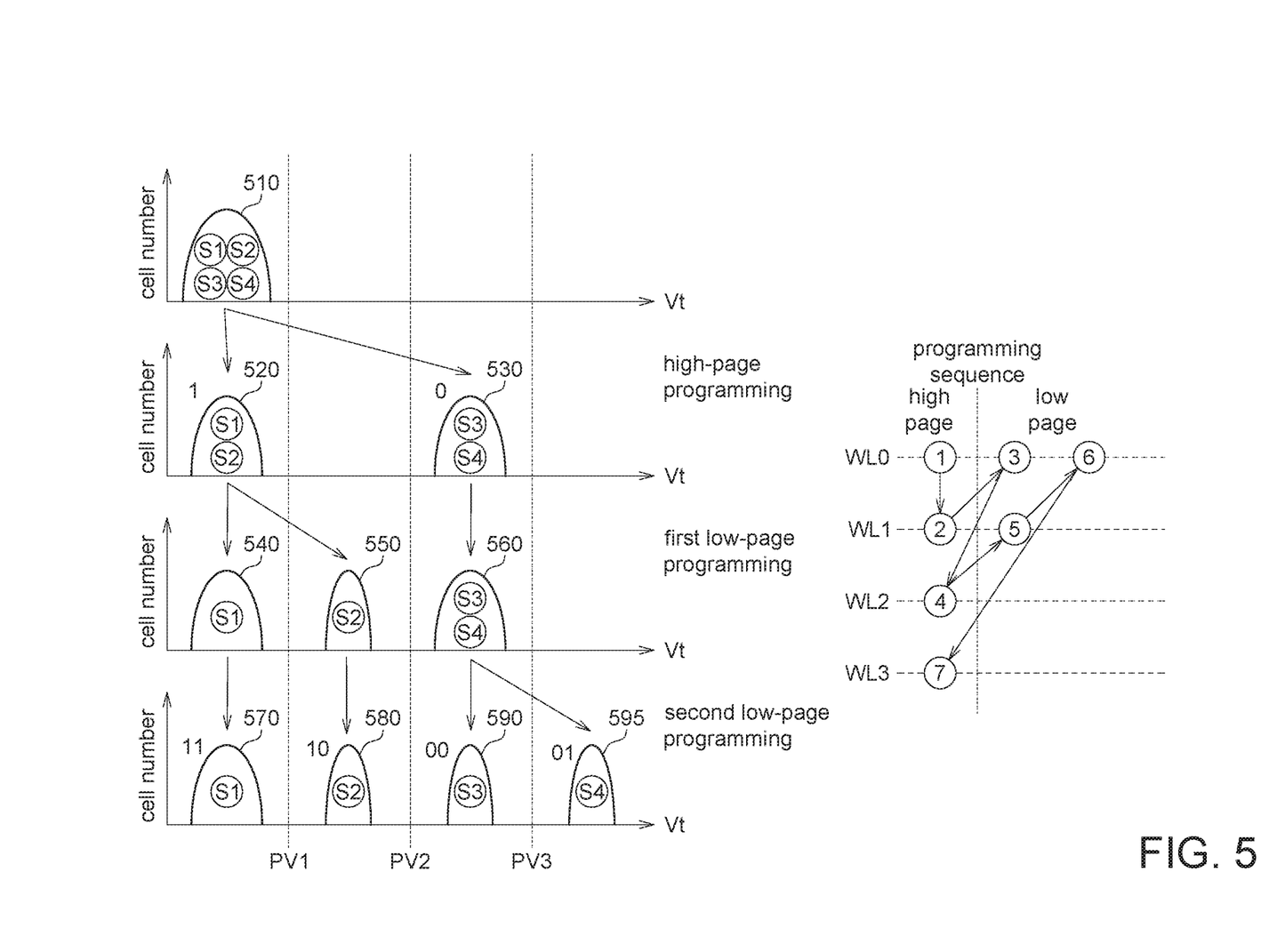
FIG. 5 shows a programming method for a memory device according to an embodiment of the application.

FIG. 5 shows a programming method for a memory device according to an embodiment of the application. The programming sequence on all word lines of the memory array in FIG. 5 is the same as that in FIG. 4.

The threshold voltage distribution 510 refers to the threshold voltage distribution of the physical pages which are erased but not programmed yet. Thus, all memory cells have the threshold voltage distribution 510 before program.

The high page of the physical page (for example the word line WL0) is programmed. For example, one or more programming voltages in the programming voltage range (17V-20V) are applied to the memory cells. Thus, in the high page, the memory cells having logic 1 have the threshold voltage distribution 520, and the memory cells having logic 0 have the threshold voltage distribution 530. The threshold voltage distribution 520 is lower than the first verification voltage PV1. The threshold voltage distribution 530 is higher than the second verification voltage PV2 but lower than the third verification voltage PV3.

A first programming operation is performed on the low page of the physical page (for example WL0). For example, one or more programming voltages in the programming voltage range (14V-17V) are applied to the memory cells. Thus, the memory cells having logic 11 have the threshold voltage distribution 540, and the memory cells having logic 10 have the threshold voltage distribution 550. The threshold voltage distribution 540 is lower than the first verification voltage PV1. The threshold voltage distribution 550 is higher than the first verification voltage PV1 but lower than the second verification voltage PV2. In other words, a 14V programming voltage is applied and it is verified whether the threshold voltage distribution 550 is higher than the first verification voltage PV1. If not, the programming voltage is raised (for example but not limited by, from 14V to 14.5V) to verify again. This is repeated until the threshold voltage distribution 550 is higher than the first verification voltage PV1.

A second programming operation is performed on the low page of the physical page (for example WL0). For example, one or more programming voltages in the programming voltage range (20V-23V) are applied to the memory cells. Thus, the memory cells having logic 00 have the threshold voltage distribution 590, and the memory cells having logic 01 have the threshold voltage distribution 595. The threshold voltage distribution 590 is higher than the second verification voltage PV2 but lower than the third verification voltage PV3. The threshold voltage distribution 595 is higher than the third verification voltage PV3. Besides, because the programming voltage is applied, the threshold voltage distribution 540 and 550 will become the threshold voltage distribution 570 and 580, wherein the threshold voltage distribution 570 is still lower than the first verification voltage PV1 and the threshold voltage distribution 580 is still higher than the first verification voltage PV1 but lower than the second verification voltage PV2. In other words, a 20V programming voltage is applied and it is verified whether the threshold voltage distribution 595 is higher than the third verification voltage PV3. If not, the programming voltage is raised (for example but not limited by, from 20V to 20.5V) to verify again. This is repeated until the threshold voltage distribution 595 is higher than the third verification voltage PV3.

By so, the programming on the memory cells is completed. As shown in FIG. 5, the memory cells having logic 11 (S1) has the threshold voltage distribution 570 (lower than the first verification voltage PV1); the memory cells having logic 10 (S2) has the threshold voltage distribution 580 (higher than the first verification voltage PV1 but lower than the second verification voltage PV2); the memory cells having logic 00 (S3) has the threshold voltage distribution 590 (higher than the second verification voltage PV2 but lower than the third verification voltage PV3); and the memory cells having logic 01 (S4) has the threshold voltage distribution 595 (higher than the third verification voltage PV3).

Figure 6:
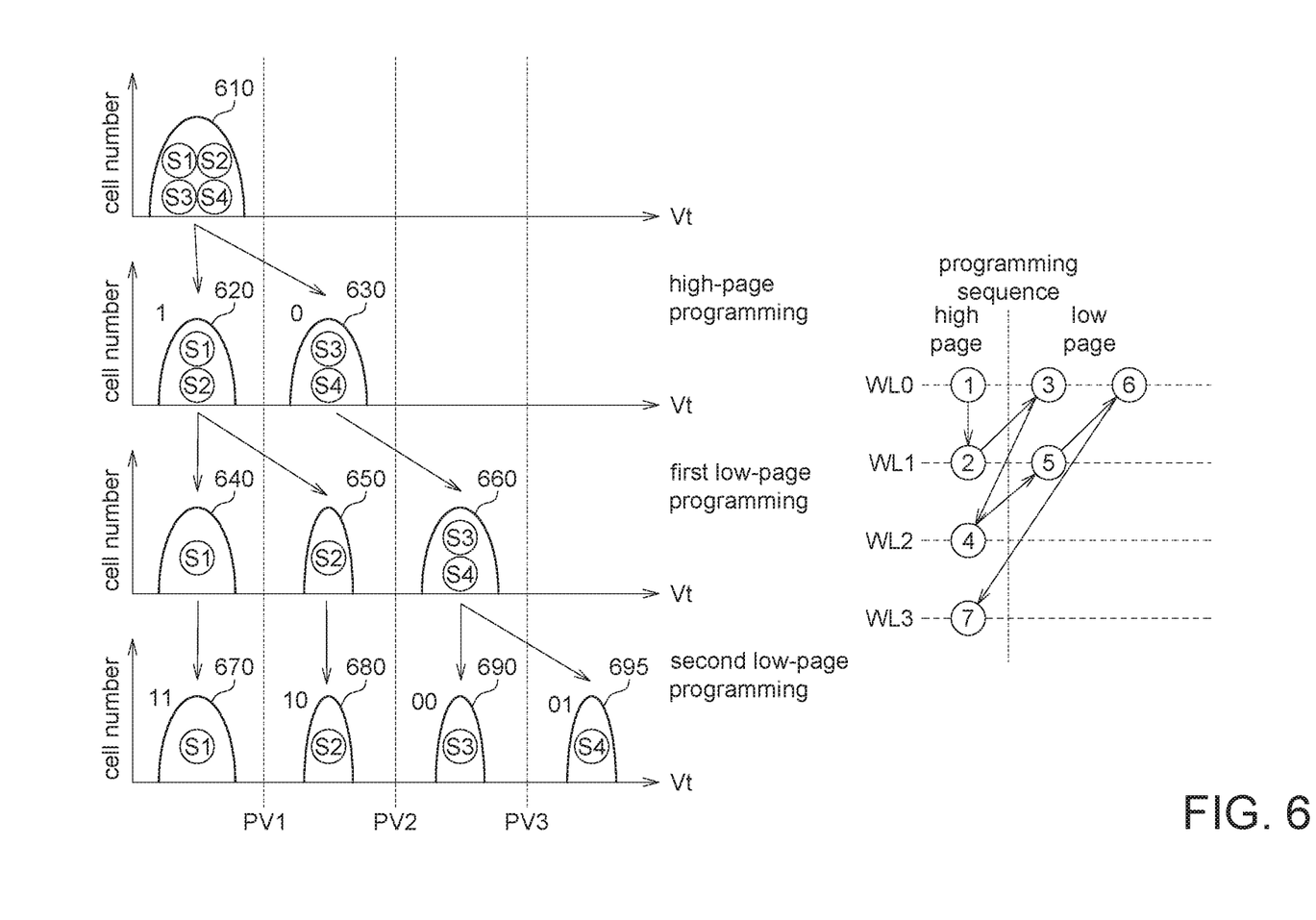
FIG. 6 shows a programming method for a memory device according to an embodiment of the application.

FIG. 6 shows a programming method for a memory device according to an embodiment of the application. The programming sequence on all word lines of the memory array in FIG. 6 is the same as that in FIG. 4.

The threshold voltage distribution 610 refers to the threshold voltage distribution of the physical pages which are erased but not programmed yet. Thus, all memory cells have the threshold voltage distribution 610 before program.

The high page of the physical page (for example the word line WL0) is programmed. For example, one or more programming voltages in the programming voltage range (14V-17V) are applied to the memory cells. Thus, in the high page, the memory cells having logic 1 have the threshold voltage distribution 620, and the memory cells having logic 0 have the threshold voltage distribution 630. The threshold voltage distribution 620 is lower than the first verification voltage PV1. The threshold voltage distribution 630 is higher than the first verification voltage PV1 but lower than the second verification voltage PV2.

A first programming operation is performed on the low page of the physical page (for example WL0). For example, one or more programming voltages in the programming voltage range (17V-20V) are applied to the memory cells. The memory cells having logic 11 have the threshold voltage distribution 640; the memory cells having logic 10 have the threshold voltage distribution 650 and the memory cells having logic 00 and 01 have the threshold voltage distribution 660. The threshold voltage distribution 640 is lower than the first verification voltage PV1. The threshold voltage distribution 650 is higher than the first verification voltage PV1 but lower than the second verification voltage PV2. The threshold voltage distribution 660 is higher than the second verification voltage PV2 but lower than the third verification voltage PV3. In other words, a 17V programming voltage is applied and it is verified whether the threshold voltage distribution 650 is higher than the first verification voltage PV1 and whether the threshold voltage distribution 660 is higher than the second verification voltage PV2. If not, the programming voltage is raised (for example but not limited by, from 17V to 17.5V) to verify again. This is repeated until the threshold voltage distribution 650 is higher than the first verification voltage PV1 and the threshold voltage distribution 660 is higher than the second verification voltage PV2.

A second programming operation is performed on the low page of the physical page (for example WL0). For example, one or more programming voltages in the programming voltage range (20V-23V) are applied to the memory cells. Thus, the memory cells having logic 00 have the threshold voltage distribution 690, and the memory cells having logic 01 have the threshold voltage distribution 695. The threshold voltage distribution 690 is higher than the second verification voltage PV2 but lower than the third verification voltage PV3. The threshold voltage distribution 695 is higher than the third verification voltage PV3. Besides, because the programming voltage is applied, the threshold voltage distribution 640 and 650 will become the threshold voltage distribution 670 and 680, wherein the threshold voltage distribution 670 is still lower than the first verification voltage PV1 and the threshold voltage distribution 680 is still higher than the first verification voltage PV1 but lower than the second verification voltage PV2. In other words, a 20V programming voltage is applied and it is verified whether the threshold voltage distribution 695 is higher than the third verification voltage PV3. If not, the programming voltage is raised (for example but not limited by, from 20V to 20.5V) to verify again. This is repeated until the threshold voltage distribution 695 is higher than the third verification voltage PV3.

By so, the programming on the memory cells is completed. As shown in FIG. 6, the memory cells having logic 11 (S1) has the threshold voltage distribution 670 (lower than the first verification voltage PV1); the memory cells having logic 10 (S2) has the threshold voltage distribution 680 (higher than the first verification voltage PV1 but lower than the second verification voltage PV2); the memory cells having logic 00 (S3) has the threshold voltage distribution 690 (higher than the second verification voltage PV2 but lower than the third verification voltage PV3); and the memory cells having logic 01 (S4) has the threshold voltage distribution 695 (higher than the third verification voltage PV3).

Figure 7:
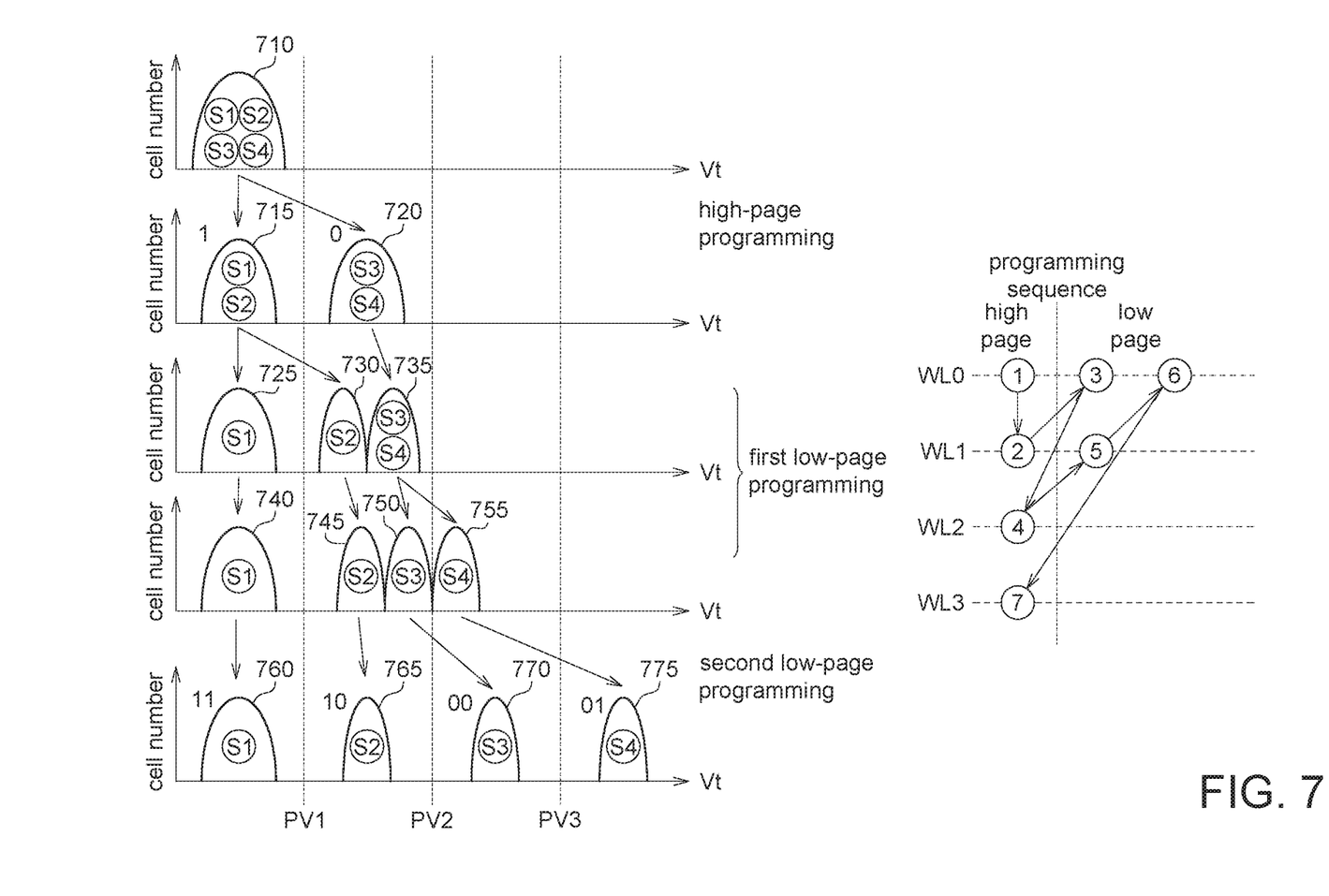
FIG. 7 shows a programming method for a memory device according to an embodiment of the application.

FIG. 7 shows a programming method for a memory device according to an embodiment of the application. The programming sequence on all word lines of the memory array in FIG. 7 is the same as that in FIG. 4.

The threshold voltage distribution 710 refers to the threshold voltage distribution of the physical pages which are erased but not programmed yet. Thus, all memory cells have the threshold voltage distribution 710 before program.

The high page of the physical page (for example the word line WL0) is programmed. For example, one or more programming voltages in the programming voltage range (14V-17V) are applied to the memory cells. Thus, in the high page, the memory cells having logic 1 have the threshold voltage distribution 715, and the memory cells having logic 0 have the threshold voltage distribution 720. The threshold voltage distribution 715 is lower than the first verification voltage PV1. The threshold voltage distribution 720 is higher than the first verification voltage PV1 but lower than the second verification voltage PV2.

A first programming operation is performed on the low page of the physical page (for example WL0). For example, one or more programming voltages in the programming voltage range (17V-20V) are applied to the memory cells. The memory cells having logic 11 have the threshold voltage distribution 725; the memory cells having logic 10 have the threshold voltage distribution 730 and the memory cells having logic 00 and 01 have the threshold voltage distribution 735. The threshold voltage distribution 725 is lower than the first verification voltage PV1. The threshold voltage distribution 730 and 735 are both higher than the first verification voltage PV1. Further, the programming voltage is continuously applied to separate threshold voltage distribution 735 to the threshold voltage distribution 750 of the memory cells having logic 00 and the threshold voltage distribution 755 of the memory cells having logic 01, but both the threshold voltage distribution 750 and 755 are higher than the first verification voltage PV1. In other words, a 17V programming voltage is applied and it is verified whether the threshold voltage distribution 730 is higher than the first verification voltage PV1. If not, the programming voltage is raised (for example but not limited by, from 17V to 17.5V) to verify again. This is repeated until the threshold voltage distribution 730 is higher than the first verification voltage PV1. Besides, in the first programming on the low page, the programming voltage are continuously raised until the threshold voltage distribution 750 of the memory cells having logic 00 is separated from the threshold voltage distribution 755 of the memory cells having logic 01.

A second programming operation is performed on the low page of the physical page (for example WL0). For example, one or more programming voltages in the programming voltage range (20V-23V) are applied to the memory cells. Thus, the memory cells having logic 00 have the threshold voltage distribution 770, and the memory cells having logic 01 have the threshold voltage distribution 775. The threshold voltage distribution 770 is higher than the second verification voltage PV2 but lower than the third verification voltage PV3. The threshold voltage distribution 775 is higher than the third verification voltage PV3. Besides, because the programming voltage is applied, the threshold voltage distribution 740 and 745 will become the threshold voltage distribution 760 and 765, wherein the threshold voltage distribution 760 is still lower than the first verification voltage PV1 and the threshold voltage distribution 765 is still higher than the first verification voltage PV1 but lower than the second verification voltage PV2. In other words, a 20V programming voltage is applied and it is verified whether the threshold voltage distribution 770 is higher than the second verification voltage PV2 and whether the threshold voltage distribution 775 is higher than the third verification voltage PV3. If not, the programming voltage is raised (for example but not limited by, from 20V to 20.5V) to verify again. This is repeated until the threshold voltage distribution 770 is higher than the second verification voltage PV2 and the threshold voltage distribution 775 is higher than the third verification voltage PV3.

By so, the programming on the memory cells is completed. As shown in FIG. 7, the memory cells having logic 11 (S1) has the threshold voltage distribution 760 (lower than the first verification voltage PV1); the memory cells having logic 10 (S2) has the threshold voltage distribution 765 (higher than the first verification voltage PV1 but lower than the second verification voltage PV2); the memory cells having logic 00 (S3) has the threshold voltage distribution 770 (higher than the second verification voltage PV2 but lower than the third verification voltage PV3); and the memory cells having logic 01 (S4) has the threshold voltage distribution 775 (higher than the third verification voltage PV3).

Figure 8:
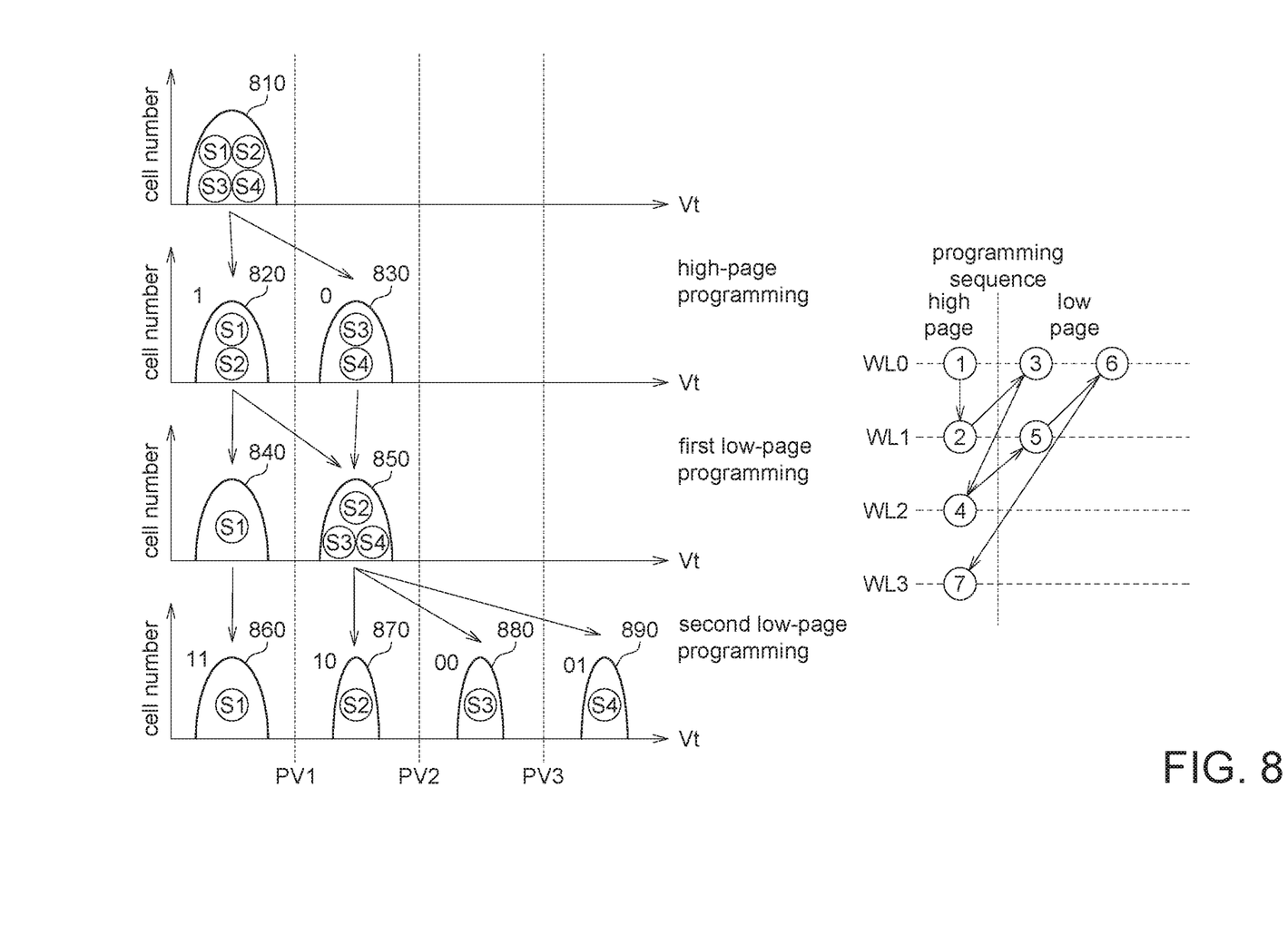
FIG. 8 shows a programming method for a memory device according to an embodiment of the application.

FIG. 8 shows a programming method for a memory device according to an embodiment of the application. The programming sequence on all word lines of the memory array in FIG. 8 is the same as that in FIG. 4.

The threshold voltage distribution 810 refers to the threshold voltage distribution of the physical pages which are erased but not programmed yet. Thus, all memory cells have the threshold voltage distribution 810 before program.

The high page of the physical page (for example the word line WL0) is programmed. For example, one or more programming voltages in the programming voltage range (14V-17V) are applied to the memory cells. Thus, in the high page, the memory cells having logic 1 have the threshold voltage distribution 820, and the memory cells having logic 0 have the threshold voltage distribution 830. The threshold voltage distribution 820 is lower than the first verification voltage PV1. The threshold voltage distribution 830 is higher than the first verification voltage PV1 but lower than the second verification voltage PV2.

A first programming operation is performed on the low page of the physical page (for example WL0). For example, one or more programming voltages in the programming voltage range (14V-17V) are applied to the memory cells. The memory cells having logic 11 have the threshold voltage distribution 840 (lower than the first verification voltage PV1); the memory cells having logic 10, 00 and 01 have the threshold voltage distribution 850. The threshold voltage distribution 850 is higher than the first verification voltage PV1 but lower than the second verification voltage PV2. In other words, a 14V programming voltage is applied and it is verified whether the threshold voltage distribution 850 is higher than the first verification voltage PV1. If not, the programming voltage is raised (for example but not limited by, from 14V to 14.5V) to verify again. This is repeated until the threshold voltage distribution 850 is higher than the first verification voltage PV1.

A second programming operation is performed on the low page of the physical page (for example WL0). For example, one or more programming voltages in the programming voltage range (17V-23V) are applied to the memory cells. Thus, the memory cells having logic 10 have the threshold voltage distribution 870, the memory cells having logic 00 have the threshold voltage distribution 880, and the memory cells having logic 01 have the threshold voltage distribution 890. The threshold voltage distribution 870 is higher than the first verification voltage PV1 but lower than the second verification voltage PV2. The threshold voltage distribution 880 is higher than the second verification voltage PV2 but lower than the third verification voltage PV3. The threshold voltage distribution 890 is higher than the third verification voltage PV3. In other words, a 17V programming voltage is applied and it is verified whether the threshold voltage distribution 880 is higher than the second verification voltage PV2 and whether the threshold voltage distribution 890 is higher than the third verification voltage PV3. If not, the programming voltage is raised (for example but not limited by, from 17V to 17.5V) to verify again. This is repeated until the threshold voltage distribution 880 is higher than the second verification voltage PV2 and the threshold voltage distribution 890 is higher than the third verification voltage PV3.

By so, the programming on the memory cells is completed. As shown in FIG. 8, the memory cells having logic 11 (S1) has the threshold voltage distribution 860 (lower than the first verification voltage PV1); the memory cells having logic 10 (S2) has the threshold voltage distribution 870 (higher than the first verification voltage PV1 but lower than the second verification voltage PV2); the memory cells having logic 00 (S3) has the threshold voltage distribution 880 (higher than the second verification voltage PV2 but lower than the third verification voltage PV3); and the memory cells having logic 01 (S4) has the threshold voltage distribution 890 (higher than the third verification voltage PV3).

As described above, in embodiments of the application, two or more programming operations are performed on the low page to eliminate the program disturbance caused by programming of adjacent word lines.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A programming method for a memory device including a memory array and a controller, the memory array including a plurality of memory cells, the programming method comprising:
performing a third programming on a first page of a first word line of the memory array by the controller;
performing the third programming on the first page of a second word line of the memory array by the controller, the second word line being adjacent to the first word line;
performing a first programming on a second page of the first word line of the memory array by the controller;
performing the third programming on the first page of a third word line of the memory array by the controller, the third word line being adjacent to the second word line;
performing the first programming on the second page of the second word line of the memory array by the controller; and
performing a second programming on the second page of the first word line of the memory array by the controller;
wherein the first programming indicates that the second page of the first word line of the memory array is programmed by the controller for the first time, and the second programming indicates that the second page of the first word line of the memory array is programmed by the controller for the second time.

2. The programming method according to claim 1, wherein:
performing the third programming on the first page of the first word line of the memory array by the controller includes:

applying at least one programming voltage in a second programming voltage range to the plurality of memory cells, so that the plurality of memory cells having first and second threshold voltage distribution, the first threshold voltage distribution being lower than a first verification voltage, and the second threshold voltage distribution being higher than a second verification voltage, performing the first programming on the second page of the first word line of the memory array by the controller includes:

applying at least one programming voltage in a third programming voltage range to the plurality of memory cells, so that the plurality of memory cells, which having a third logic status, having a third threshold voltage distribution, the plurality of memory cells, which having a fourth logic status, having a fourth threshold voltage distribution, the third threshold voltage distribution being higher than the second verification voltage but lower than a third verification voltage, the fourth threshold voltage distribution being higher than the third verification voltage;

performing the second programming on the second page of the first word line of the memory array by the controller includes applying at least one programming voltage in a first programming voltage range to the plurality of memory cells, so that the plurality of memory cells, which having a first logic status, having a fifth threshold voltage distribution, the plurality of memory cells, which having a second logic status, having a sixth threshold voltage distribution, the fifth threshold voltage distribution being lower than the first verification voltage, the sixth threshold voltage distribution being higher than the first verification voltage but lower than the second verification voltage;

the first verification voltage being lower than the second verification voltage, and the second verification voltage being lower than the third verification voltage; and the first programming voltage range being lower than the second programming voltage range, and the second verification voltage being lower than the third programming voltage range.

3. The programming method according to claim 1, wherein:

performing the third programming on the first page of the first word line of the memory array by the controller includes:

applying at least one programming voltage in a second programming voltage range to the plurality of memory cells, so that the plurality of memory cells having first and second threshold voltage distribution, the first threshold voltage distribution being lower than a first verification voltage and the second threshold voltage distribution being higher than a second verification voltage;

performing the first programming on the second page of the first word line of the memory array by the controller includes:

applying at least one programming voltage in a first programming voltage range to the plurality of memory cells, so that the plurality of memory cells, which having a first logic status, having a third threshold voltage distribution, the plurality of memory cells, which having a second logic status, having a fourth threshold voltage distribution, the third threshold voltage distribution being lower than the first verification voltage, and the fourth threshold voltage distribution being higher than the first verification voltage but lower than the second verification voltage;

performing the second programming on the second page of the first word line of the memory array by the controller includes:

applying at least one programming voltage in a third programming voltage range to the plurality of memory cells, so that the plurality of memory cells, which having a third logic status, having a fifth threshold voltage distribution, the plurality of memory cells, which having a fourth logic status, having a sixth threshold voltage distribution, the fifth threshold voltage distribution being higher than the second verification voltage but lower than a third verification voltage and the sixth threshold voltage distribution being higher than the third verification voltage;

the first verification voltage being lower than the second verification voltage, and the second verification voltage being lower than the third verification voltage; and the first programming voltage range being lower than the second programming voltage range, and the second verification voltage being lower than the third programming voltage range.

4. The programming method according to claim 1, wherein:

performing the third programming on the first page of the first word line of the memory array by the controller includes:

applying at least one programming voltage in a first programming voltage range to the plurality of memory cells, so that the plurality of memory cells having first and second threshold voltage distribution, the first threshold voltage distribution being lower than a first verification voltage and the second threshold voltage distribution being higher than the first verification voltage;

performing the first programming on the second page of the first word line of the memory array by the controller includes:

applying at least one programming voltage in a second programming voltage range to the plurality of memory cells, so that the plurality of memory cells, which having a first logic status, having a third threshold voltage distribution, the plurality of memory cells, which having a second logic status, having a fourth threshold voltage distribution, and the plurality of memory cells, which having a third and a fourth logic status, having a fifth threshold voltage distribution, the third threshold voltage distribution being lower than the first verification voltage, the fourth threshold voltage distribution being higher than the first verification voltage but lower than a second verification voltage, and the fifth threshold voltage distribution being higher than the second verification voltage but lower than a third verification voltage;

performing the second programming on the second page of the first word line of the memory array by the controller includes applying at least one programming voltage in a third programming voltage range to the plurality of memory cells, so that the plurality of memory cells, which having the third logic status, having a sixth threshold voltage distribution, the plurality of memory cells, which having the fourth logic status, having a seventh threshold voltage distribution, the sixth threshold voltage distribution being higher than the second verification voltage but lower than the third verification voltage and the seventh threshold voltage distribution being higher than the third verification voltage;

the first verification voltage being lower than the second verification voltage, and the second verification voltage being lower than the third verification voltage; and the first programming voltage range being lower than the second programming voltage range, and the second verification voltage being lower than the third programming voltage range.

5. The programming method according to claim 1, wherein:

performing the third programming on the first page of the first word line of the memory array by the controller includes:

applying at least one programming voltage in a first programming voltage range to the plurality of memory cells, so that the plurality of memory cells having first and second threshold voltage distribution, the first threshold voltage distribution being lower than a first verification voltage and the second threshold voltage distribution being higher than the first verification voltage;

performing the first programming on the second page of the first word line of the memory array by the controller includes:

applying at least one programming voltage in a second programming voltage range to the plurality of memory cells, so that the plurality of memory cells, which having a first logic status, having a third threshold voltage distribution, the plurality of memory cells, which having a second logic status, having a fourth threshold voltage distribution, the plurality of memory cells, which having a third logic status, having a fifth threshold voltage distribution, and the plurality of memory cells, which having a fourth logic status, having a sixth threshold voltage distribution, the third threshold voltage distribution being lower than the first verification voltage, the fourth threshold voltage distribution being higher than the first verification voltage but lower than a second verification voltage, and the fifth and the sixth threshold voltage distribution being higher than the second verification voltage;

performing the second programming on the second page of the first word line of the memory array by the controller includes applying at least one programming voltage in a third programming voltage range to the plurality of memory cells, so that the plurality of memory cells, which having the third logic status, having a seventh threshold voltage distribution, the plurality of memory cells, which having the fourth logic status, having a eighth threshold voltage distribution, the seventh threshold voltage distribution being higher than the second verification voltage but lower than a third verification voltage and the eighth threshold voltage distribution being higher than the third verification voltage;

the first verification voltage being lower than the second verification voltage, and the second verification voltage being lower than the third verification voltage; and the first programming voltage range being lower than the second programming voltage range, and the second verification voltage being lower than the third programming voltage range.

6. The programming method according to claim 1, wherein:

performing the third programming on the first page of the first word line of the memory array by the controller includes:

applying at least one programming voltage in a first programming voltage range to the plurality of memory cells, so that the plurality of memory cells having first and second threshold voltage distribution, the first threshold voltage distribution being lower than a first verification voltage and the second threshold voltage distribution being higher than the first verification voltage but lower than a second verification voltage;

performing the first programming on the second page of the first word line of the memory array by the controller includes:

applying at least one programming voltage in the first programming voltage range to the plurality of memory cells, so that the plurality of memory cells, which having a first logic status, having a third threshold voltage distribution, the plurality of memory cells, which having second, third and fourth logic status, having a fourth threshold voltage distribution, the third threshold voltage distribution being lower than the first verification voltage, the fourth threshold voltage distribution being higher than the first verification voltage but lower than the second verification voltage;

performing the second programming on the second page of the first word line of the memory array by the controller includes applying at least one programming voltage in second and third programming voltage ranges to the plurality of memory cells, so that the plurality of memory cells, which having the second logic status, having a fifth threshold voltage distribution, the plurality of memory cells, which having the third logic status, having a sixth threshold voltage distribution, the plurality of memory cells, which having the fourth logic status, having a seventh threshold voltage distribution, the fifth threshold voltage distribution being higher than the first verification voltage but lower than the second verification voltage, the sixth threshold voltage distribution being higher than the second verification voltage but lower than a third verification voltage and the seventh threshold voltage distribution being higher than the third verification voltage;

the first verification voltage being lower than the second verification voltage, and the second verification voltage being lower than the third verification voltage; and the first programming voltage range being lower than the second programming voltage range, and the second verification voltage being lower than the third programming voltage range.

7. A memory device comprising:
a memory array including a plurality of memory cells; and
a controller coupled to the memory array, the controller being configured to control:
  performing a third programming on a first page of a first word line of the memory array;
  performing the third programming on the first page of a second word line of the memory array, the second word line being adjacent to the first word line;
  performing a first programming on a second page of the first word line;
  performing the third programming on the first page of a third word line of the memory array, the third word line being adjacent to the second word line;
  performing the first programming on the second page of the second word line of the memory array; and
  performing a second programming on the second page of the first word line of the memory array
  wherein the first programming indicates that the second page of the first word line of the memory array is programmed by the controller for the first time, and the second programming indicates that the second page of the first word line of the memory array is programmed by the controller for the second time.

8. The memory device according to claim 7, wherein:
in performing the third programming on the first page of the first word line of the memory array, the controller is configured to control:
applying at least one programming voltage in a second programming voltage range to the plurality of memory cells,
so that the plurality of memory cells having first and second threshold voltage distribution,
the first threshold voltage distribution being lower than a first verification voltage, and the second threshold voltage distribution being higher than a second verification voltage,
in performing the first programming on the second page of the first word line of the memory array, the controller is configured to control:
applying at least one programming voltage in a third programming voltage range to the plurality of memory cells,
so that the plurality of memory cells, which having a third logic status, having a third threshold voltage distribution,
the plurality of memory cells, which having a fourth logic status, having a fourth threshold voltage distribution,
the third threshold voltage distribution being higher than the second verification voltage but lower than a third verification voltage, the fourth threshold voltage distribution being higher than the third verification voltage;

in performing the second programming on the second page of the first word line of the memory array, the controller is configured to control:
applying at least one programming voltage in a first programming voltage range to the plurality of memory cells,
so that the plurality of memory cells, which having a first logic status, having a fifth threshold voltage distribution,
the plurality of memory cells, which having a second logic status, having a sixth threshold voltage distribution,
the fifth threshold voltage distribution being lower than the first verification voltage, the sixth threshold voltage distribution being higher than the first verification voltage but lower than the second verification voltage;
the first verification voltage being lower than the second verification voltage, and the second verification voltage being lower than the third verification voltage; and
the first programming voltage range being lower than the second programming voltage range, and the second verification voltage being lower than the third programming voltage range.

9. The memory device according to claim 7, wherein:
in performing the third programming on the first page of the first word line of the memory array, the controller is configured to control:
applying at least one programming voltage in a second programming voltage range to the plurality of memory cells,
so that the plurality of memory cells having first and second threshold voltage distribution,
the first threshold voltage distribution being lower than a first verification voltage and the second threshold voltage distribution being higher than a second verification voltage;
in performing the first programming on the second page of the first word line of the memory array, the controller is configured to control:
applying at least one programming voltage in a first programming voltage range to the plurality of memory cells,
so that the plurality of memory cells, which having a first logic status, having a third threshold voltage distribution,
the plurality of memory cells, which having a second logic status, having a fourth threshold voltage distribution,
the third threshold voltage distribution being lower than the first verification voltage, and the fourth threshold voltage distribution being higher than the first verification voltage but lower than the second verification voltage;
in performing the second programming on the second page of the first word line of the memory array, the controller is configured to control:
applying at least one programming voltage in a third programming voltage range to the plurality of memory cells,
so that the plurality of memory cells, which having a third logic status, having a fifth threshold voltage distribution,
the plurality of memory cells, which having a fourth logic status, having a sixth threshold voltage distribution, the fifth threshold voltage distribution being higher than the second verification voltage but lower than a third verification voltage and the sixth threshold voltage distribution being higher than the third verification voltage;

the first verification voltage being lower than the second verification voltage, and the second verification voltage being lower than the third verification voltage; and the first programming voltage range being lower than the second programming voltage range, and the second verification voltage being lower than the third programming voltage range.

10. The memory device according to claim 7, wherein:

in performing the third programming on the first page of the first word line of the memory array, the controller is configured to control:

applying at least one programming voltage in a first programming voltage range to the plurality of memory cells, so that the plurality of memory cells having first and second threshold voltage distribution, the first threshold voltage distribution being lower than a first verification voltage and the second threshold voltage distribution being higher than the first verification voltage;

in performing the first programming on the second page of the first word line of the memory array, the controller is configured to control:

applying at least one programming voltage in a second programming voltage range to the plurality of memory cells, so that the plurality of memory cells, which having a first logic status, having a third threshold voltage distribution, the plurality of memory cells, which having a second logic status, having a fourth threshold voltage distribution, and the plurality of memory cells, which having a third and a fourth logic status, having a fifth threshold voltage distribution, the third threshold voltage distribution being lower than the first verification voltage, the fourth threshold voltage distribution being higher than the first verification voltage but lower than a second verification voltage, and the fifth threshold voltage distribution being higher than the second verification voltage but lower than a third verification voltage;

in performing the second programming on the second page of the first word line of the memory array, the controller is configured to control:

applying at least one programming voltage in a third programming voltage range to the plurality of memory cells, so that the plurality of memory cells, which having the third logic status, having a sixth threshold voltage distribution, the plurality of memory cells, which having the fourth logic status, having a seventh threshold voltage distribution, the sixth threshold voltage distribution being higher than the second verification voltage but lower than the third verification voltage and the seventh threshold voltage distribution being higher than the third verification voltage;

the first verification voltage being lower than the second verification voltage, and the second verification voltage being lower than the third verification voltage; and the first programming voltage range being lower than the second programming voltage range, and the second verification voltage being lower than the third programming voltage range.

11. The memory device according to claim 7, wherein:

in performing the third programming on the first page of the first word line of the memory array, the controller is configured to control:

applying at least one programming voltage in a first programming voltage range to the plurality of memory cells, so that the plurality of memory cells having first and second threshold voltage distribution, the first threshold voltage distribution being lower than a first verification voltage and the second threshold voltage distribution being higher than the first verification voltage;

in performing the first programming on the second page of the first word line of the memory array, the controller is configured to control:

applying at least one programming voltage in a second programming voltage range to the plurality of memory cells, so that the plurality of memory cells, which having a first logic status, having a third threshold voltage distribution, the plurality of memory cells, which having a second logic status, having a fourth threshold voltage distribution, the plurality of memory cells, which having a third logic status, having a fifth threshold voltage distribution, and the plurality of memory cells, which having a fourth logic status, having a sixth threshold voltage distribution, the third threshold voltage distribution being lower than the first verification voltage, the fourth threshold voltage distribution being higher than the first verification voltage but lower than a second verification voltage, and the fifth and the sixth threshold voltage distribution being higher than the second verification voltage;

in performing the second programming on the second page of the first word line of the memory array, the controller is configured to control applying at least one programming voltage in a third programming voltage range to the plurality of memory cells, so that the plurality of memory cells, which having the third logic status, having a seventh threshold voltage distribution, the plurality of memory cells, which having the fourth logic status, having a eighth threshold voltage distribution, the seventh threshold voltage distribution being higher than the second verification voltage but lower than a third verification voltage and the eighth threshold voltage distribution being higher than the third verification voltage;

the first verification voltage being lower than the second verification voltage, and the second verification voltage being lower than the third verification voltage; and the first programming voltage range being lower than the second programming voltage range, and the second verification voltage being lower than the third programming voltage range.

12. The memory device according to claim 7, wherein:

in performing the third programming on the first page of the first word line of the memory array, the controller is configured to control:

applying at least one programming voltage in a first programming voltage range to the plurality of memory cells, so that the plurality of memory cells having first and second threshold voltage distribution, the first threshold voltage distribution being lower than a first verification voltage and the second threshold voltage distribution being higher than the first verification voltage but lower than a second verification voltage;

in performing the first programming on the second page of the first word line of the memory array, the controller is configured to control:

applying at least one programming voltage in the first programming voltage range to the plurality of memory cells, so that the plurality of memory cells, which having a first logic status, having a third threshold voltage distribution, the plurality of memory cells, which having second, third and fourth logic status, having a fourth threshold voltage distribution, the third threshold voltage distribution being lower than the first verification voltage, the fourth threshold voltage distribution being higher than the first verification voltage but lower than the second verification voltage;

in performing the second programming on the second page of the first word line of the memory array, the controller is configured to control:

applying at least one programming voltage in second and third programming voltage ranges to the plurality of memory cells, so that the plurality of memory cells, which having the second logic status, having a fifth threshold voltage distribution, the plurality of memory cells, which having the third logic status, having a sixth threshold voltage distribution, the plurality of memory cells, which having the fourth logic status, having a seventh threshold voltage distribution, the fifth threshold voltage distribution being higher than the first verification voltage but lower than the second verification voltage, the sixth threshold voltage distribution being higher than the second verification voltage but lower than a third verification voltage and the seventh threshold voltage distribution being higher than the third verification voltage;

the first verification voltage being lower than the second verification voltage, and the second verification voltage being lower than the third verification voltage; and the first programming voltage range being lower than the second programming voltage range, and the second verification voltage being lower than the third programming voltage range.

* * * * *